(12) United States Patent
Malling

(10) Patent No.: US 6,446,247 B1
(45) Date of Patent: Sep. 3, 2002

(54) OPTIMIZATION OF PRINTED WIRE CIRCUITRY ON A SINGLE SURFACE USING A CIRCLE DIAMETER

(75) Inventor: Donald J. Malling, Brackney, PA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/450,875

(22) Filed: Nov. 29, 1999

(51) Int. Cl.[7] .............................................. G06F 17/50
(52) U.S. Cl. ....................................................... 716/15
(58) Field of Search ......................... 257/401; 716/1–21

(56) References Cited

U.S. PATENT DOCUMENTS

| | | | |
|---|---|---|---|
| 3,621,208 A | 11/1971 | Islett et al. ................... 716/12 |
| 4,642,890 A | 2/1987 | Hechtman et al. ............ 29/846 |
| 4,746,966 A | 5/1988 | Fitzgerald et al. .......... 257/203 |
| 4,852,016 A | 7/1989 | McGehee ..................... 716/12 |
| 5,187,671 A | 2/1993 | Cobb ........................... 716/12 |
| 5,295,082 A | 3/1994 | Chang et al. ................. 716/12 |
| 5,309,371 A | 5/1994 | Shikata et al. ................ 716/9 |
| 5,400,063 A | 3/1995 | Kappel ......................... 716/12 |
| 5,465,217 A | 11/1995 | Yip et al. ..................... 716/21 |
| 5,473,195 A | 12/1995 | Koike .......................... 716/14 |
| 5,578,840 A | 11/1996 | Scepanovic et al. ........ 257/207 |
| 5,581,098 A | 12/1996 | Chang ......................... 257/211 |
| 5,808,330 A | 9/1998 | Rostoker et al. ............. 257/208 |
| 5,880,969 A | 3/1999 | Hama et al. ................. 716/12 |
| 6,097,073 A | * 8/2000 | Rostoker ..................... 257/401 |

* cited by examiner

Primary Examiner—Matthew Smith
Assistant Examiner—Thuan Do
(74) Attorney, Agent, or Firm—Scully, Scott, Murphy & Presser; John R. Pivnicnhy

(57) ABSTRACT

A method of routing and sizing of wires in the formation of wiring paths extending through a region. More particularly, the method relates to optimizing the routing and sizing of printed wire circuitry on a single surface, such as on semiconductor devices.

12 Claims, 5 Drawing Sheets

OPTIMIZATION OF PRINTED WIRE CIRCUITRY ON A SINGLE SURFACE USING A CIRCLE DIAMETER

BACKGROUND OF THE INVENTION

1. Field of the Invention

The present invention relates to a method of routing and sizing of wires in the formation of wiring paths extending through a region; and more particularly, relates to optimizing the routing and sizing of printed wire circuitry on a single surface, such as on semiconductor devices.

In the implementation of the positioning and sizing of the printed wire circuitry on semiconductor devices or substrates, an important aspect is to be able to utilize printed wire widths and spacings which are optimized with regard to the amount of available spacing on the surface of the device or substrate. In particular, for fine pitch ballgrid array chip carriers (PBGA) the printed circuitry wire widths and spacings vary in accordance with the amount of space which is available on the device or semiconductor surface. Thus, as the available spacing for the printed wires decreases, in view of the number of wires which must pass between the ballgrid array paths or other converting locations or the like, the width of each respective wire must necessarily decrease; whereas conversely, as the available space increases, the wire widths should also be increased in order to take advantage of the increased spatial availability.

Presently, optimization of printed wire circuitry through the intermediary of correlating wire widths and spacing in conformance with available surface space is implemented essentially manually, utilizing design automation of presently known software systems; for instance, such as AutoCad, Cadence, IGS or GYM. In order to be able to optimize the wire sizing and spacing of printed wire circuitry on a surface, such as that on a semiconductor device or the like, a single surface layer may potentially require as much as eighty hours of experimentation and implementation by a designer in order to obtain an optimized wire sizing and spacing on the surface.

2. Discussion of the Prior Art

Although numerous publications are currently available which direct themselves to the routing and spacing of printed wires on surfaces, for instance, such as on single surface or multiple surfaces of semiconductor devices, these do not address themselves to the problem of obtaining optimized printed wire widths and spacings in correlation with the amount of available spacing across a particular surfaces onto which the wires are to be applied.

Rostoker et al. U.S. Pat. No. 5,808,330 and associated Scepanovic U.S. Pat. No. 5,578,840 each disclose multi-directional interconnect routing of wiring and orthogonal through-connect for the terminals of microelectronic cells of integrated circuits. In particular, the routing architecture discloses hexagonally shaped cells, although other polygonal shapes such as triangles or parallelograms maybe utilized in order to provide for a tri-directional or multi-directional routing of wiring across surfaces. There is no disclosure or suggestion of optimizing wire widths and wire spacing over available surface space so as to optimize the printed wire circuitry on an essentially single surface of a semiconductor device.

Hama et al. U.S. Pat. No. 5,808,969 discloses a method and apparatus for deciding a wire routing and for detecting a critical cut when positioning printed wire circuitry on a surface. There is no disclosure of optimizing wire size and spacing in correlation with an available surface area.

Chang U.S. Pat. No. 5,581,098 discloses circuit routing structure in a multi-layer product and does not address itself to the optimization of interconnect wire widths and spacings or positioning thereof on an available surface area.

Koike U.S. Pat. No. 5,473,195 relates to a wiring arrangement which is variable in width or intervals when positioned on semi-conductor integrated circuit devices or chips. Wire widths are computed so that the propagation times for multi-bit signals arrive at the same time when different wire lengths are required for each bit. There is no suggestion of the optimization of wire widths and wire spacings in correlation with an available surface area on a semiconductor device.

Yip et al. U.S. Pat. No. 5,465,217 pertains to the provision of fan out patterns for wire routing in order to attain allowable combinations of fan in and fan out angles, so as to select optimal routing on the basis of electrical characteristics. There is no utilization of optimizing wire widths and spacing with regard to correlation with a semi-conductor or ballgrid array surface area.

Kappel U.S. Pat. No. 5,400,063 relates to the wiring layout for ink jet printers and, resultingly provides for optimizing wire widths and spacing in a limited manner directed to special applications which do not lend themselves to a routing of optimized wire widths and spacings at any angle across an available surface area.

Shikata et al. U.S. Pat. No. 5,309,371 relates to the layout of positions of integrated circuit blocks on a semiconductor chip, generally referred to in the technology, as floor planning. The publication does not address itself to the optimization of wire widths and spacing in correlation with an available surface area on which the wire circuitry is being plotted.

Chang et al. U.S. Pat. No. 5,295,082 relates to the orthogonal wiring of multichip module interconnects and does not address itself to the optimization of wire widths and spacings when routed across an available surface area, such as the surface of a semiconductor device.

Cobb U.S. Pat. No. 5,187,671 pertains to selecting the shortest to the longest wire paths utilizing binary trees in order to provide for an automated interconnect routing system. There is no disclosure nor suggestion of employing optimization of wire widths and wire spacings correlated with available space on a semiconductor surface.

McGehee U.S. Pat. No. 4,852,016 relates to integrated circuit chip layouts and wiring, but does not address itself to optimization of wire widths and spacing in correlation with available surface areas on a semi-conductor device.

Fitzgerald et al. U.S. Pat. No. 4,746,966 is directed to integrated circuit chip layout and wiring with regard to logic circuit layouts for large scale integrated circuits. There is no disclosure of optimizing wire widths and spacings in correlation with available surface areas on a semiconductor device.

Hechtman et al. U.S. Pat. No. 4,642,890 is directed to a method for routing non-crossing conductive paths such as wires extending between each of two families of conductive nodes, and which may employ electrostatic analog aspects. There is no optimization of spacing between conductors nor is there any optimization of conductor wire width in correlation with an available surface area on a semiconductor device.

Finally, Isett U.S. Pat. No. 3,621,208 pertains to the arrangement of connections with regard to single point interconnection routing in accordance with wire lengths.

There is no concern with regard to the optimization of wire widths and wire spacings in correlation with available surface space, particularly on an semi-conductor device.

In summation, none of the prior art publications or those known in the current technology address themselves to the routing of wiring paths through a surface region, particularly such as in a semiconductor device, and wherein there is provided an optimization of wire sizes and spacings in correlation with available surface areas on the device.

SUMMARY OF THE INVENTION

According to the invention, an optimized printed wire circuitry provided on a single surface through the adjustment of wire line widths and placement is, in effect, implemented through the intermediary of a computer software algorithm which automatically routes printed circuit wires while adjusting wire widths in a placement according to available space, so as to route the wiring paths between lands or other fixed shapes or patterns, such as BGA pads, by connecting the lands through the provision of a region having borders, and which are positioned at intersections of the borders and lands and from a box-like area therebetween. Provided are a plurality of guidelines, each of which intersects one or more of the borders or lands, by determining the number of guidelines intersecting each of the borders, positioning on the borders equal-diameter imaginary circles of the same number as the number of guidelines intersecting the borders, and stepping the circles inwardly in a software algorithm while adjusting the diameters of adjacent of the circles to fill the spaces between the lands thereby forming paths of circles, defining the routing and wire sizing of optimized wiring paths according to the paths of the inwardly stepping circles and diameters of the circles, respectively.

The foregoing; in essence, provides for an optimization through the application of a software or computerized algorithm using adjustable diameter circles in correlation with guidelines so as to be able to optimize the respective wire widths and their angular projections and mutual spacings in correlation with an available space or region within the borders having the lands connecting the corners thereof.

In essence, this will enable all the wires within a specified surface area to be routed, sized and spaced concurrently in time from the beginning to the end of the algorithm within a minimum period of time, thereby drastically reducing present time requirements in laying out optimized wire line widths and placement or surface routing conditions.

Accordingly, it is an object of the present invention to provide a method for the optimization in a computerized algorithmic mode of wire widths and spacings thereof for the formation of printed wire circuitry on a surface area in correlation with the space available thereon.

A further object is to provide a method of optimizing in a printed wiring circuit wire widths and spacings extending across a single surface area of a semiconductor device.

Yet another object of the present invention is to provide an algorithm utilizing computer-generated guide lines and stepped circles for rapidly and efficiently analyzing available space on a surface area so as to be able to route a plurality of optimized wire sizes and spacings in conformance with a surface area on a semiconductor device, such as BGA carriers, which is available for routing and positioning the wires.

BRIEF DESCRIPTION OF THE DRAWINGS

Reference may now be had to the following detailed description of a preferred embodiment of the invention, taken in conjunction with the accompanying drawings; and in which.

DETAILED DESCRIPTION OF A PREFERRED EMBODIMENT

Figure 1:
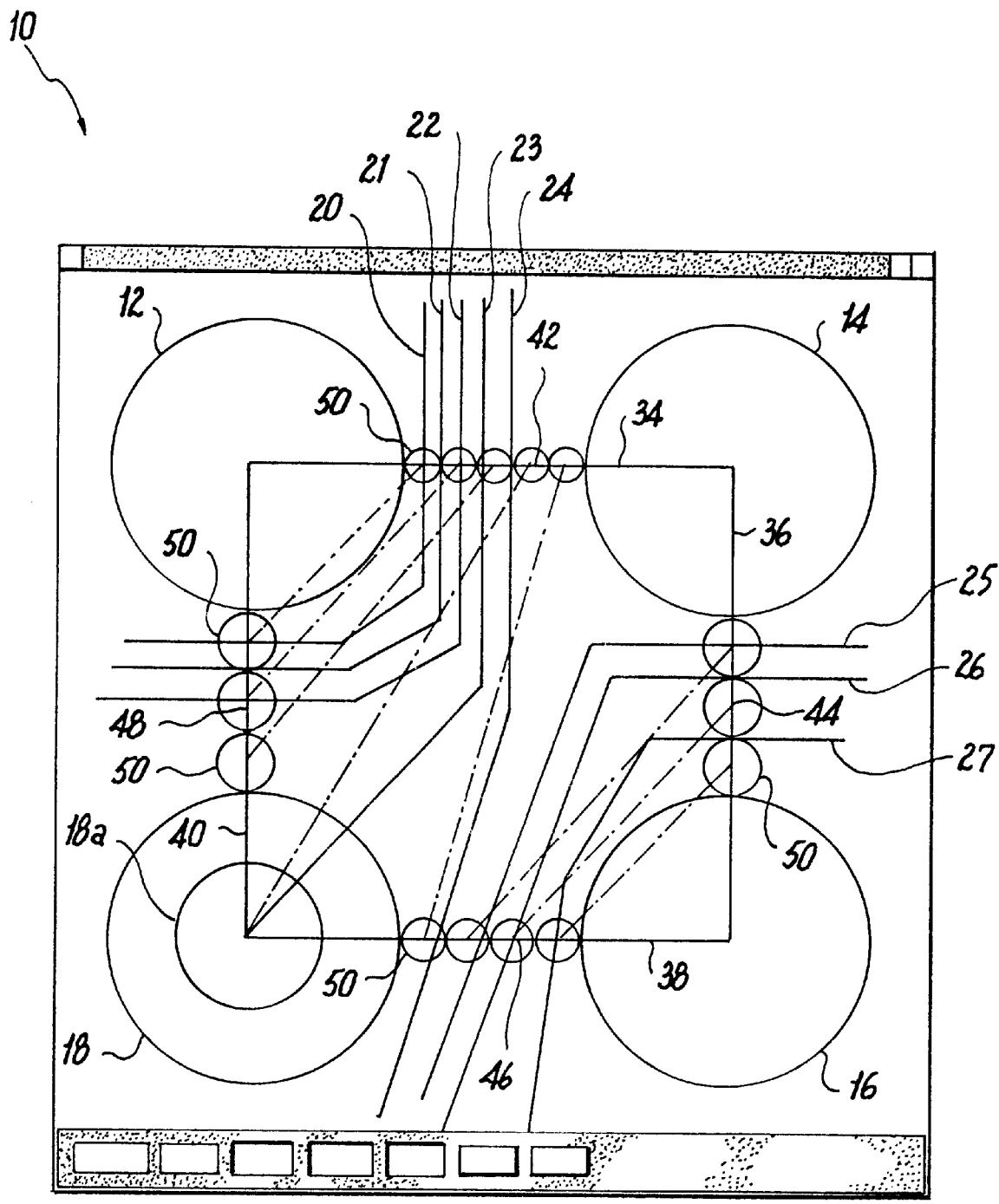
FIG. 1 illustrates generally diagrammatically, the commencement of an algorithm for positioning wires and dimensioning their wire widths and routing the wires in an optimized manner within a specified surface region, such as on a semiconductor device.

Referring now in specific detail to the drawings, as illustrated in FIG. 1 there is shown a computer representation of a surface 10 which may be considered to be the area of a semiconductor device. Arranged within the surface are a plurality of lands 12, 14, 16 and 18, or other regions which; for example, may be pads 18a for ballgrid arrays (BGAs) which are to be either interconnected by printed wire circuitry, or which form boundaries for passages for the routing of wires therebetween and to provide for suitable wire interconnections.

The algorithm for implementing the optimized routing of circuitry wires which are to be imprinted on the surface may be implemented by detecting where suitable guidelines 20, 21, 22, 23, 24 intersect first border portion 34 of an imaginary border box which is formed as a positioning connection between the various lands or wire paths.

Guide lines 25, 26, 27 intersect a second border portion 36, with all of the above guide lines being plotted to angularly extend inwardly of the surface region. Hereby, guide lines 20, 21 and 22 are angled to extend between a border portion 40; guide line 23 extends to land or pad 18; whereas guide lines 24, 25, 26 and 27 extend through the region so as to pass through the border portion 38.

The particular spacings or passages 42, 44, 46, 48 present between the lands 12, 14, 16 and 18 are then divided equally through the intermediary of a plurality of imaginary circles 50 which are created by means of the computer software.

Figure 2:
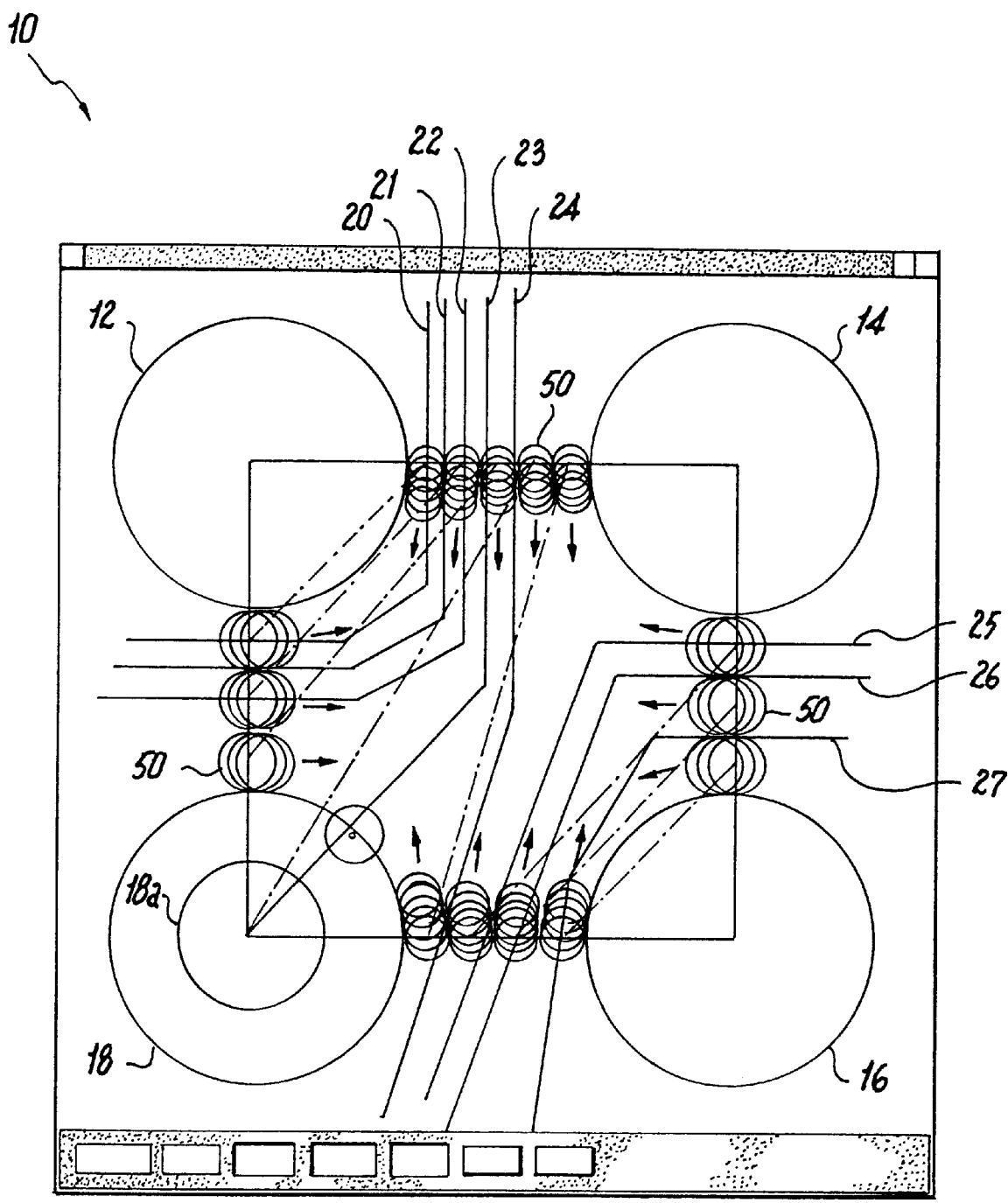
FIG. 2 illustrates a continuation in the algorithm devising the path of an optimized wire routing of a plurality of wires through guide lines and stepped imaginary plotting circles.

As shown in FIG. 2 of the drawings, the wires are being connected by "stepping" or forwardly; in effect dividing the space equally among the wires in each stepping set located between the respective BGA pads or lands. Each path of a stepped circle 50 represents the path of an optimized wire, both as to its size or width and spacings relative to adjacent wires so as to be able to correlate the wire spacing and size with the available area within the imaginary box which has been drawn between the lands.

Figure 3:
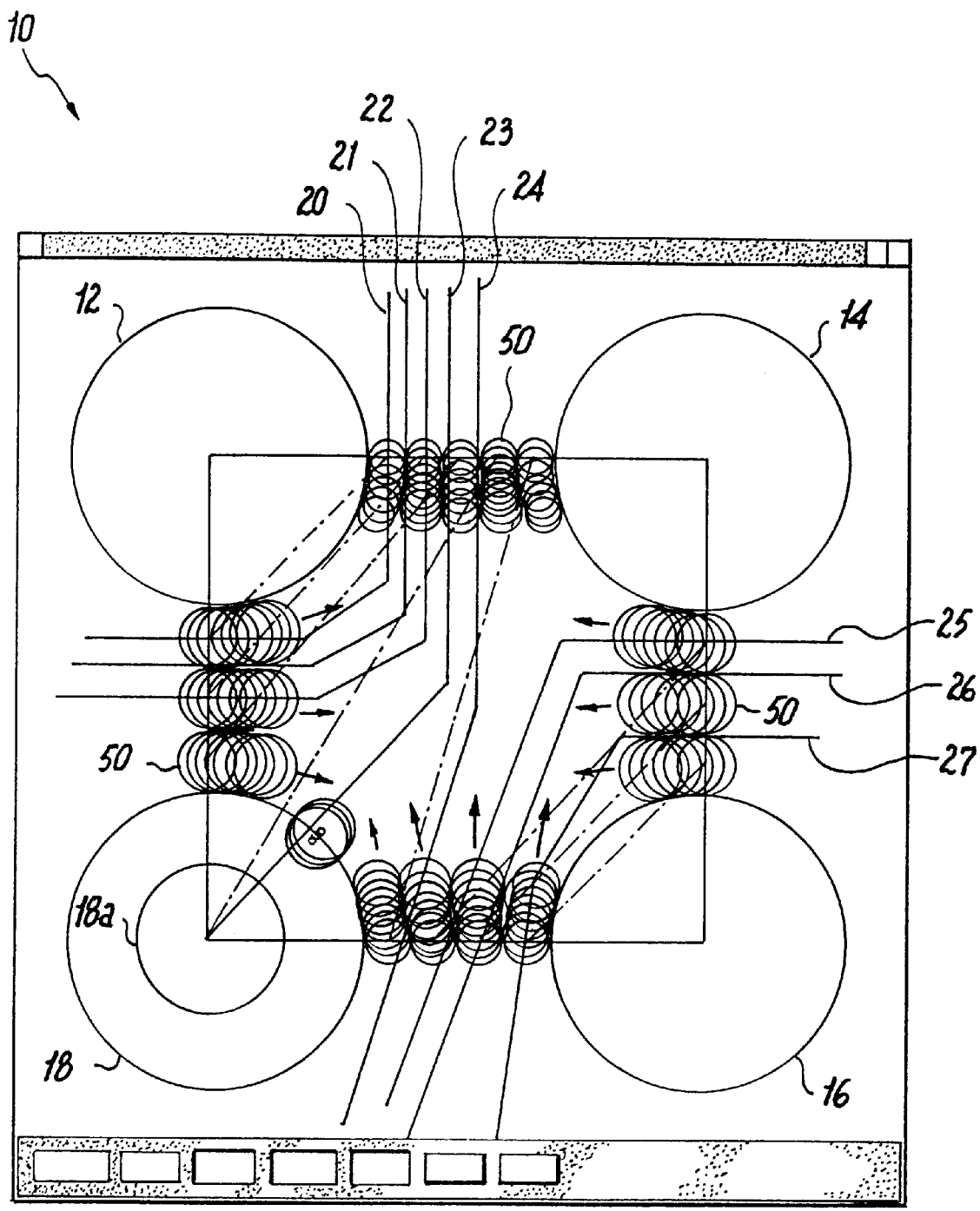
FIG. 3 illustrates a further step in employing the algorithm of routing and sizing the wires in an optimized mode.

As shown in FIG. 3, the circles 50 are being stepped forwardly into the box, and increase in size so as to be contiguously in contact with circles of an adjacent wire while filling out the widening spaces between the lands or paths inwardly of the box.

Figure 4:
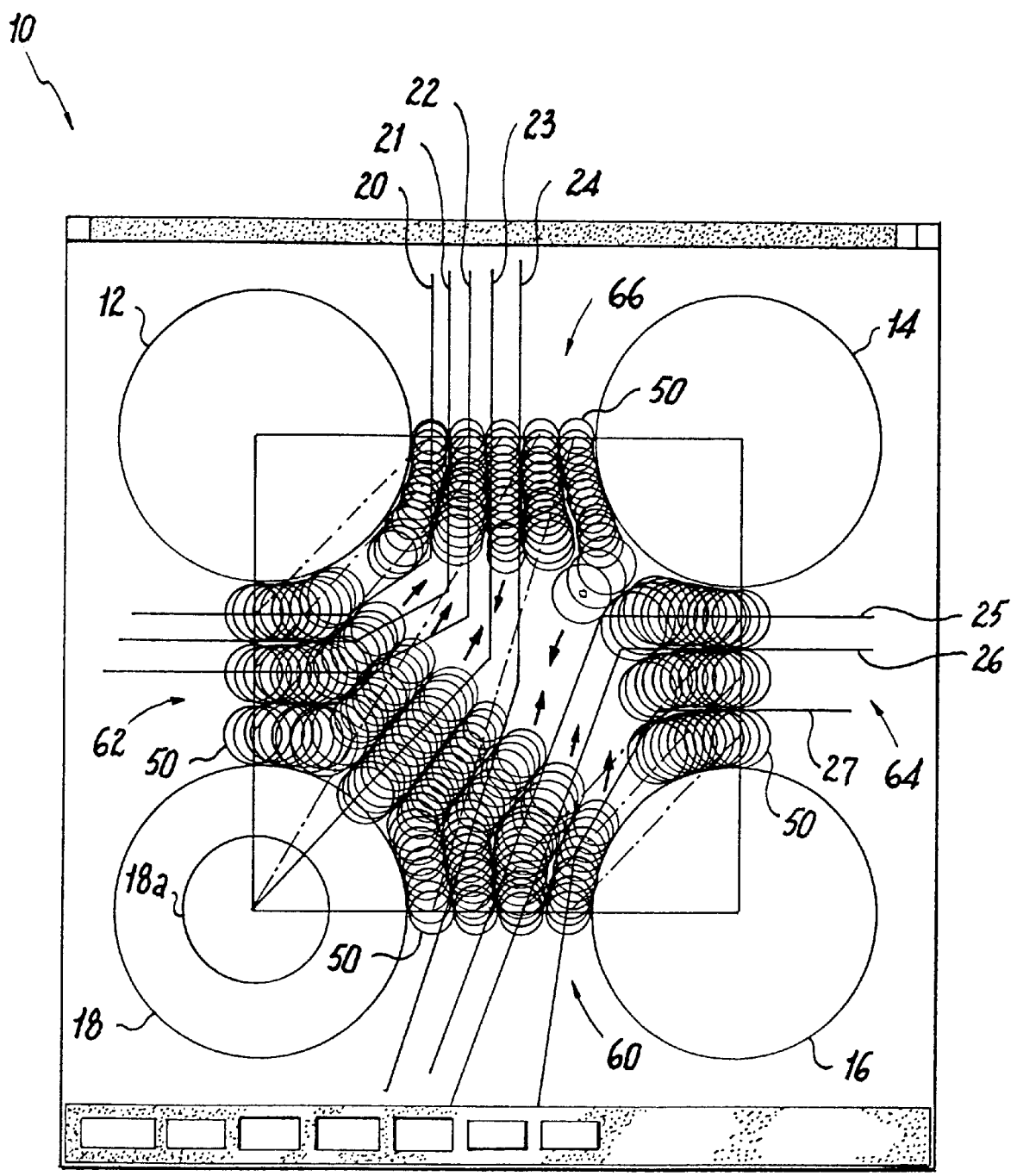
FIG. 4 illustrates a still further step in the utilizing stepping sets of circles for plotting the routing and sizing of the wires.
Figure 5:
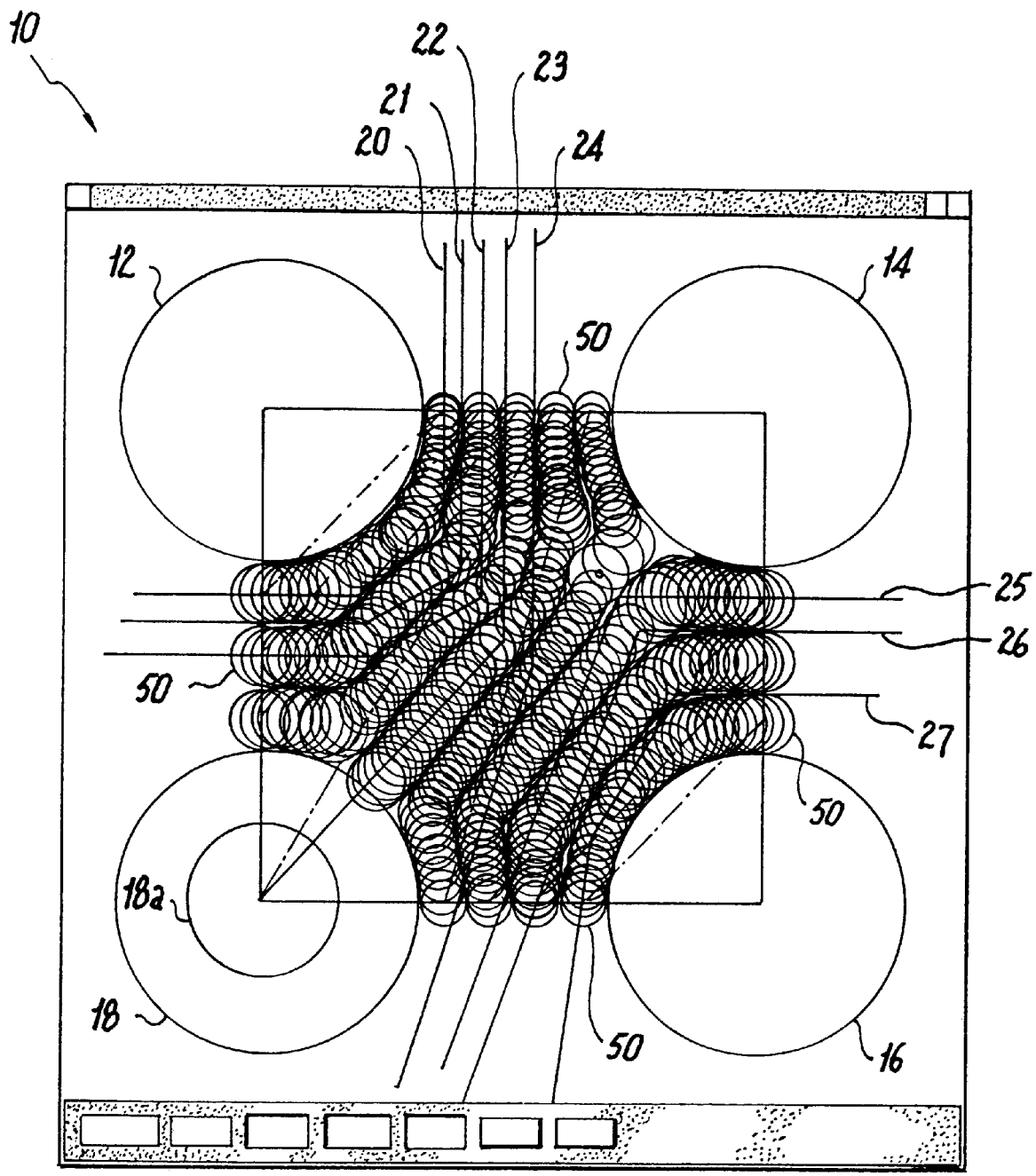
FIG. 5 illustrates a completed algorithm in the routing of the wires and determination of optimized wire size and spacings as required by a particular physical application.

The concave depression of the merged stepping sets 60 and 62, as shown in FIG. 4 of the drawings, has been filled in with circles, and the stepping sets 64 and 66 have been merged by filling in the concave depression.

As indicated in the final step of the algorithm employed in routing the wire paths, the region within the box has now been completely filled in with the imaginary stepped software circles 50 representing the recited paths and the optimized widths of the wires in a printed wire circuitry.

The foregoing process or algorithm is adapted to provide a complete utilization of the available surface area on the semiconductor device, and also to enable it to be equipped with wires of optimized widths and spacings relative to each other.

The inventive method of implementing the algorithm for optimizing the wire sizing and placement or routing can thus be automatically effected within an extremely short period of time by simply stepping and manipulating the circles 50 which are plotted to be representative of wire paths intermediate the various lands or BGA pads, wherein the surface may be that of a fine pitch BGA carrier. Consequently, in contrast with the state of the art, the present method can be implemented within a matter of minutes or a very short period of time in contrast with many tedious hours of manpower having been heretofore necessary to provide for an optimized wire sizing and routing of the wires, particularly such as are utilized in connection with printed wire circuitry for semiconductor devices.

While the invention has been particularly shown and described with respect to preferred embodiments thereof, it will be understood by those skilled in the art that the foregoing and other changes in form and details may be made therein without departing from the spirit and scope of the invention.

I claim:

1. A method of routing and sizing wiring paths through a surface region, comprising:
   (a) defining borders on said region and lands at intersections of said borders so as to form a space intermediate each of said lands;
   (b) providing a plurality of guide lines each of which simulates an approximate wiring path, each said guide line extending through at least one said space and selectively intersecting one or more of said borders and lands;
   (c) positioning a number of imaginary circles of equal diameters in the spaces between said lands on said borders, said circles being equal in number to the number of guide lines in each said respective space;
   (d) dimensioning said circles so as to fill said spaces on said borders intermediate said bands; and
   (e) stepping said circles manually of said region while concurrently adjusting the circle diameters to fill the available spaces therebetween so as to form simulated wiring paths.

2. A method as claimed in claim 1, wherein said adjustment of the circle diameters concurrently defines optimized wiring paths extending across said region and optimized wire widths for each of said wiring paths.

3. A method as claimed in claim 1, wherein said guide lines are directed in specified angularly oriented paths so as to provide predetermined wiring paths and connections within a minimum optimized space within said region.

4. A method as claimed in claim 1, wherein at least some of said bands comprise pads for ball grid arrays.

5. A method as claimed in claim 1, wherein said surface region comprises a surface of a semiconductor device.

6. A method as claimed in claim 1, wherein said method is implemented by a computer software algorithm.

7. A computerized system for routing and sizing wiring paths through a surface region, comprising:
   (a) defining borders on said region and lands at intersections of said borders so as to form a space intermediate each of said lands;
   (b) providing a plurality of guide lines each of which simulates an approximate wiring path, each said guide line extending through at least one said space and selectively intersecting one or more of said borders and lands;
   (c) positioning a number of imaginary circles of equal diameters in the spaces between said lands on said borders, said circles being equal in number to the number of guide lines in each said respective space;
   (d) dimensioning said circles so as to fill said spaces on said borders intermediate said bands; and
   (e) stepping said circles manually of said region while concurrently adjusting the circle diameters to fill the available spaces therebetween so as to form simulated wiring paths.

8. A system as claimed in claim 7, wherein said adjustment of the circle diameters concurrently defines optimized wiring paths extending across said region and optimized wire widths for each of said wiring paths.

9. A system as claimed in claim 7, wherein said guide lines are directed in specified angularly oriented paths so as to provide predetermined wiring paths and connections within a minimum optimized space within said region.

10. A system as claimed in claim 7, wherein at least some of said bands comprise pads for ball grid arrays.

11. A system as claimed in claim 7, wherein said surface region comprises a surface of a semiconductor device.

12. A system as claimed in claim 7, wherein said system is implemented by a computer software algorithm.

* * * * *